US008505194B2

(12) United States Patent
Ban et al.

(10) Patent No.: US 8,505,194 B2
(45) Date of Patent: Aug. 13, 2013

(54) APPARATUS OF MOUNTING COMPONENT (75) Inventors: Jong-eok Ban, Changwon (KR); Byung-Ju Kim, Changwon (KR)

(73) Assignee: Samsung Techwin Co., Ltd., Changwon (KR)

( * ) Notice: Subject to any disclaimer, the term of this patent is extended or adjusted under 35 U.S.C. 154(b) by 0 days.

(21) Appl. No.: 13/206,821

(22) Filed: Aug. 10, 2011

(65) Prior Publication Data
US 2012/0036711 A1    Feb. 16, 2012

(30) Foreign Application Priority Data

Aug. 10, 2010    (KR) .................. 10-2010-0076969

(51) Int. Cl.
*B23P 19/00*    (2006.01)
(52) U.S. Cl.
USPC .................... 29/743; 29/740; 29/739; 29/834
(58) Field of Classification Search
USPC ............ 29/740–743, 832–834; 226/128–129
See application file for complete search history.

(56) References Cited

U.S. PATENT DOCUMENTS

| 6,101,709 | A  | * | 8/2000  | Shiota ............................. 29/833 |
| 6,176,011 | B1 | * | 1/2001  | Shirakawa ....................... 29/832 |
| 6,266,873 | B1 | * | 7/2001  | Kitamura et al. ............... 29/832 |
| 6,571,462 | B1 | * | 6/2003  | Mimura et al. ................. 29/743 |
| 6,842,974 | B1 |   | 1/2005  | Maenishi et al. |
| 6,971,157 | B1 | * | 12/2005 | Yoshida et al. ................. 29/739 |
| 7,284,934 | B2 | * | 10/2007 | Hoogers ....................... 406/176 |
| 7,568,624 | B2 | * | 8/2009  | Kodama et al. ........... 235/462.14 |
| 7,784,660 | B2 | * | 8/2010  | Horie ............................ 226/128 |
| 8,091,216 | B2 | * | 1/2012  | Saho ............................... 29/743 |

FOREIGN PATENT DOCUMENTS

| JP | 2002-324999 A    | 11/2002 |
| JP | 2008-172073 A    | 7/2008  |
| KR | 10-2010-0083285 A | 7/2010  |

* cited by examiner

*Primary Examiner* — Minh Trinh
(74) *Attorney, Agent, or Firm* — Sughrue Mion, PLLC (57) ABSTRACT

An apparatus and method of mounting components are provided. The apparatus for mounting components includes: a component supplying unit which supplies the components so that the components move in at least one line; and a plurality of suction nozzles disposed to approach to or retreat from the components, wherein intervals between the plurality of suction nozzles are changeable so that the suction nozzles correspond to positions of the components. The method of mounting components includes: disposing a plurality of suction nozzles corresponding to the positions of the components; picking up the components by using the suction nozzles adjusting intervals between the suction nozzles; moving the suction nozzles to an upper side of a substrate, on which the components are to be mounted; and putting the components down on the substrate.

10 Claims, 8 Drawing Sheets

APPARATUS OF MOUNTING COMPONENT

CROSS-REFERENCE TO RELATED PATENT APPLICATION

This application claims priority from Korean Patent Application No. 10-2010-0076969, filed on Aug. 10, 2010, in the Korean Intellectual Property Office, the disclosure of which is incorporated herein in its entirety by reference.

BACKGROUND

1. Field

Apparatuses and methods consistent with exemplary embodiments relate to mounting electric components on a substrate.

2. Description of the Related Art

An apparatus for mounting electric components installs electric components on a substrate, for example, a printed circuit board, and generally includes a nozzle spindle, which absorbs and moves components, and a component supplying unit, which supplies the component to the nozzle spindle, for example, a carrier tape reel feeder or a vibratory bowl feeder.

Recently, in order to increase speed of installing components, an apparatus for mounting components including a plurality of nozzle spindles may be used. In the apparatus for mounting components including a plurality of nozzle spindles, components may be supplied to each of the plurality of nozzle spindles, and thus, a plurality of component supplying units such as carrier tape reel feeders or vibratory bowl feeders are needed according to the number of the nozzle spindles.

SUMMARY

One or more exemplary embodiments provide an apparatus for mounting components which may supply the components to a plurality of nozzle spindles by using one component supplying unit and a method of mounting components using the apparatus.

According to an aspect of an exemplary embodiment, there is provided an apparatus for mounting components, the apparatus including: a component supplying unit which supplies the components so that the components may move in at least one line; and a plurality of suction nozzles disposed to approach to or retreat from the components, wherein intervals between the plurality of suction nozzles are changeable so that the suction nozzles may correspond to positions of the components.

According to an aspect of another exemplary embodiment, there is provided a method of mounting components, the method including: The method of mounting components includes: disposing a plurality of suction nozzles corresponding to positions of the components; picking up the components by using the suction nozzles; adjusting intervals between the suction nozzles; moving the suction nozzles to an upper side of a substrate, on which the components are to be mounted; and putting the components down on the substrate.

BRIEF DESCRIPTION OF THE DRAWINGS

The above and other aspects will become more apparent by describing in detail exemplary embodiments thereof with reference to the attached drawings, in which.

DETAILED DESCRIPTION OF EXEMPLARY EMBODIMENTS

Hereinafter, an apparatus for mounting components according to one or more exemplary embodiments will be described in detail with reference to the accompanying drawings.

Figure 1A:
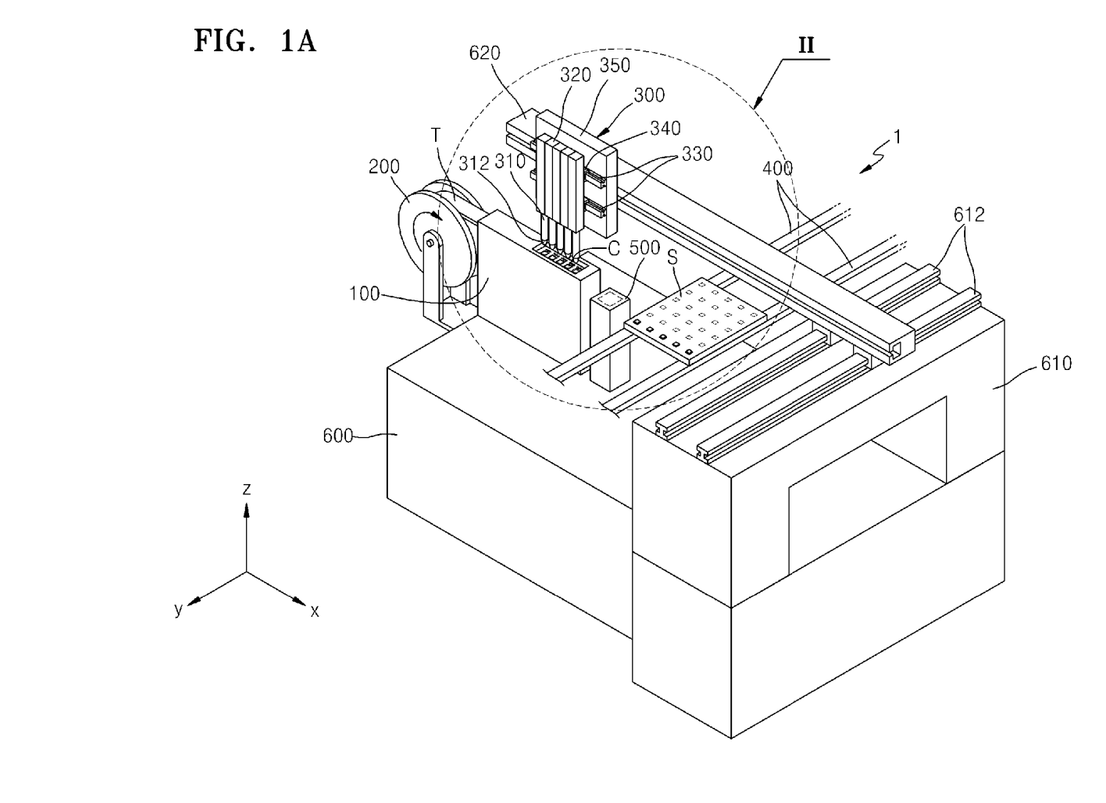
FIG. 1A is a perspective view schematically illustrating an apparatus for mounting components according to an exemplary embodiment.
Figure 1B:
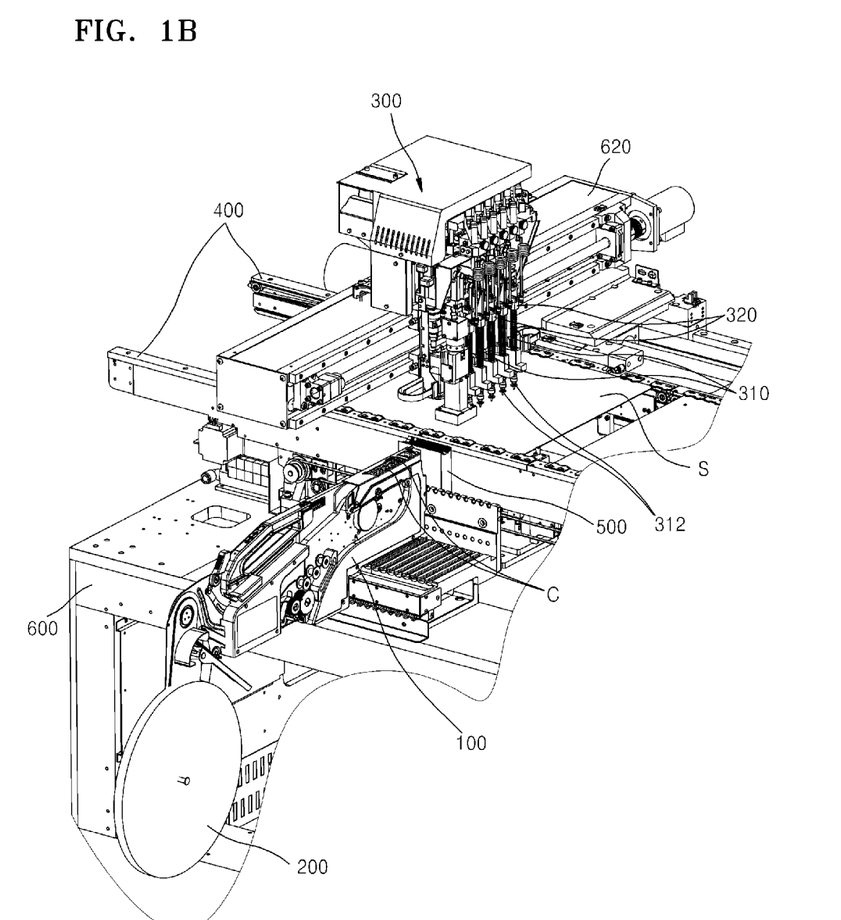
FIG. 1B is a perspective view schematically illustrating the apparatus for mounting components of FIG. 1A in more detail, according to an exemplary embodiment.
Figure 2:
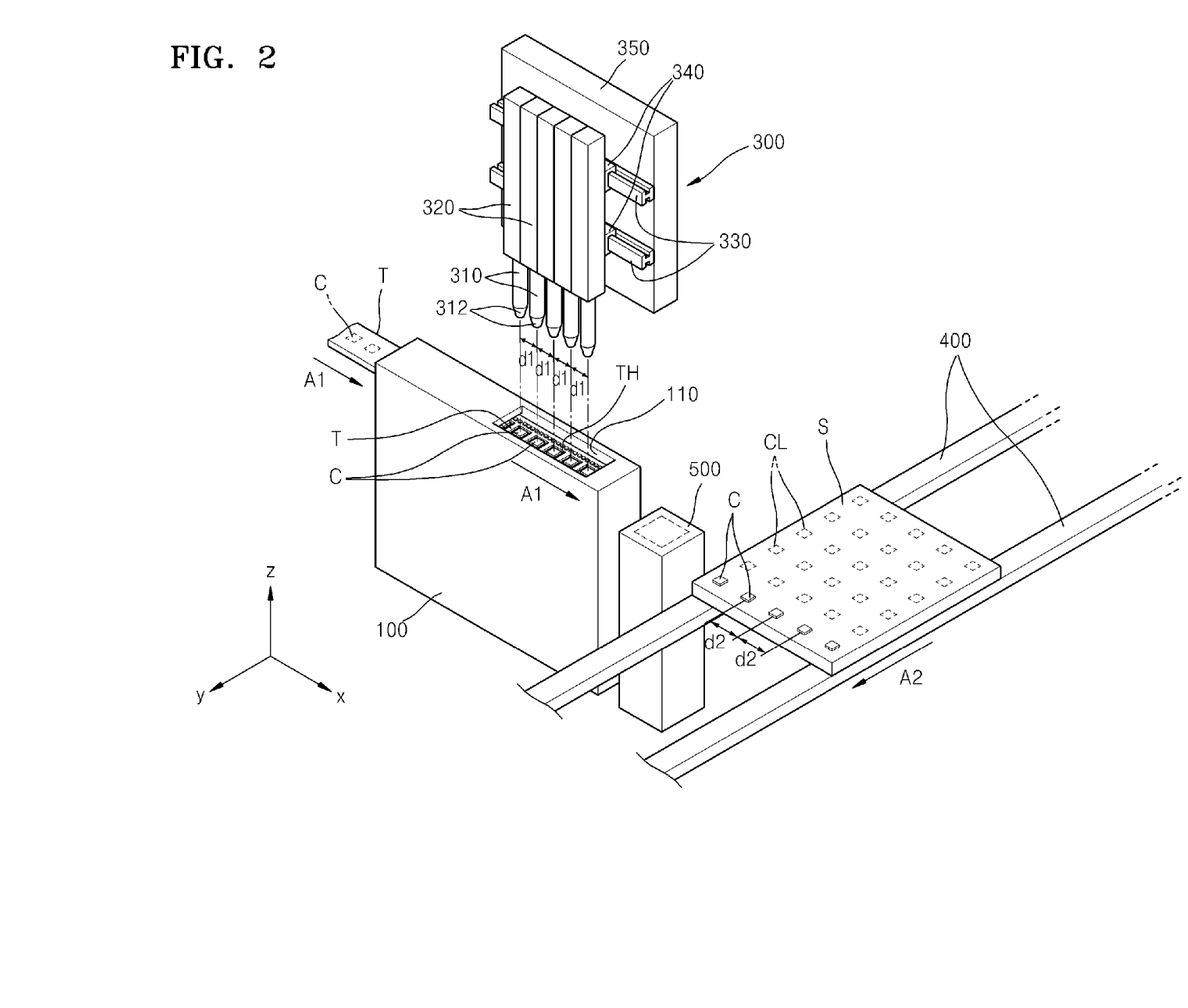
FIG. 2 is an enlarged view of part II in the apparatus for mounting components of FIG. 1A, according to an exemplary embodiment.
Figure 3:
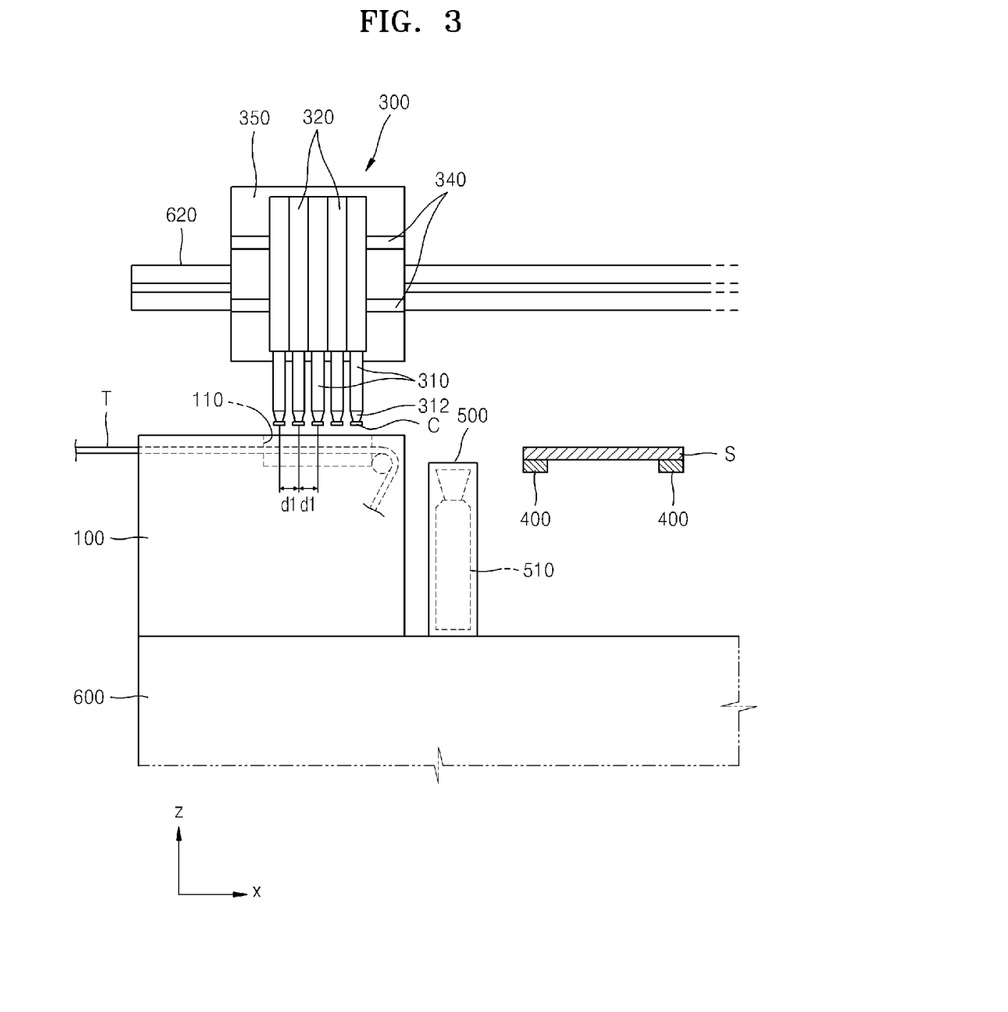
FIGS. 3 through 5 are front views schematically illustrating partial operation states of the apparatus for mounting components of FIG. 1A, according to exemplary embodiments.
Figure 4:
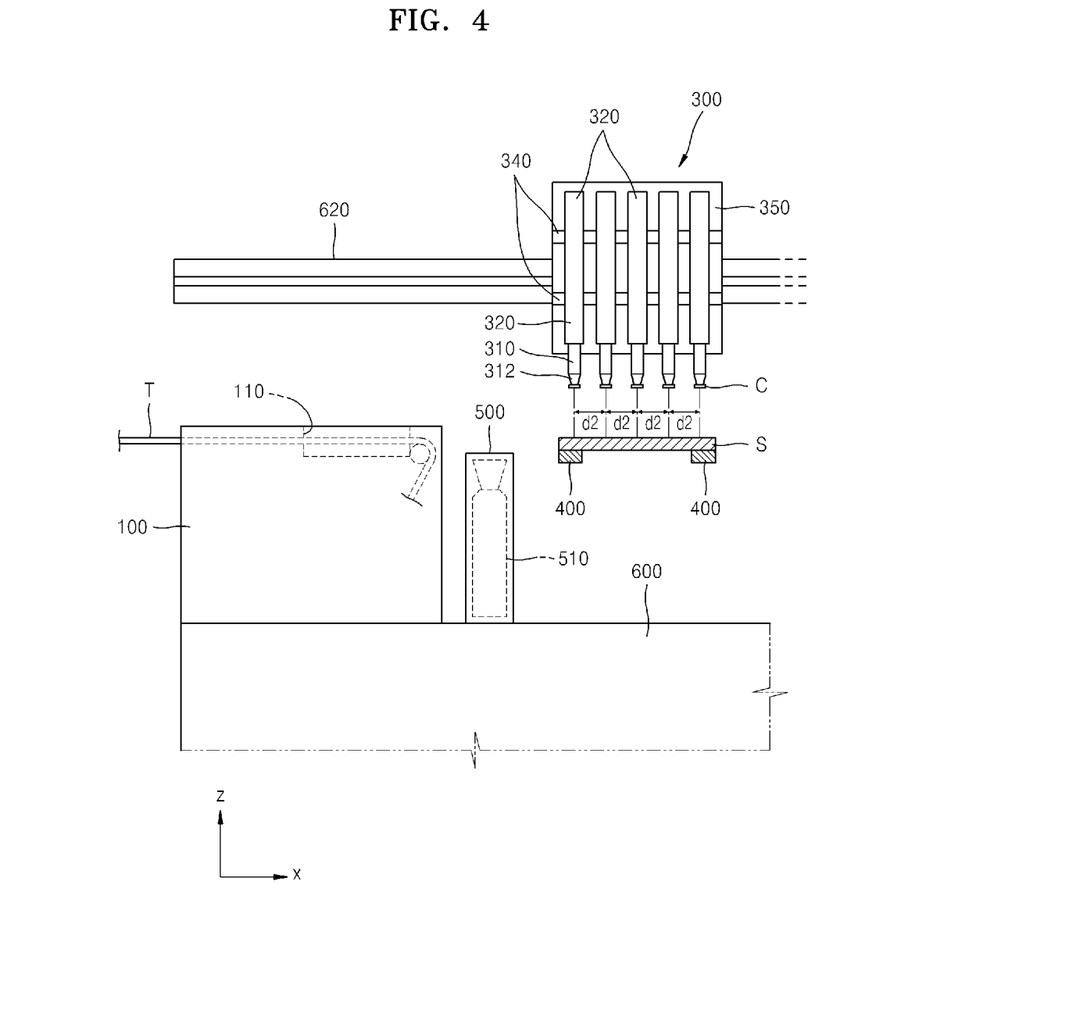
Figure 5:
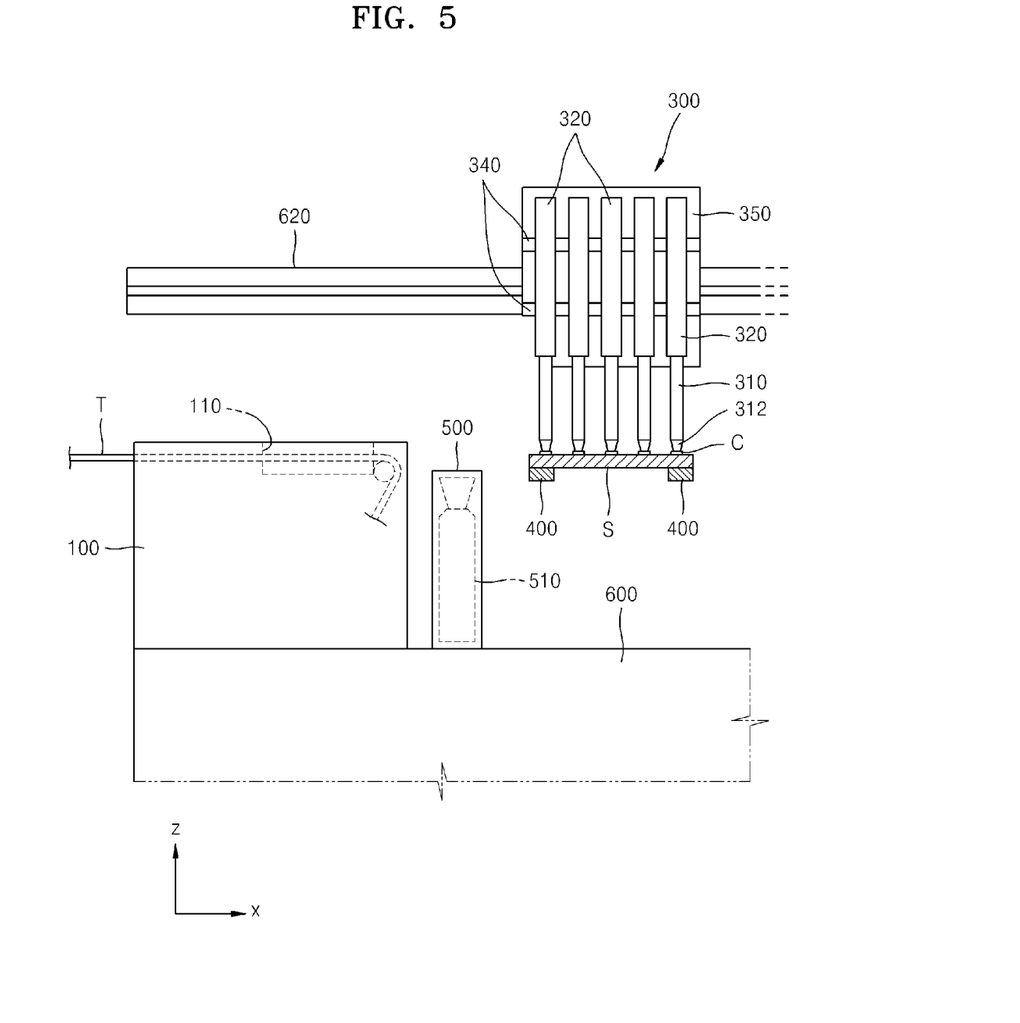

FIG. 1A is a perspective view schematically illustrating an apparatus 1 for mounting components according to an exemplary embodiment, FIG. 1B is a perspective view schematically illustrating the apparatus 1 for mounting components in more detail, according to an exemplary embodiment, FIG. 2 is an enlarged view of part II in the apparatus 1 for mounting components as shown in FIG. 1, according to an exemplary embodiment, and FIGS. 3 through 5 are front views schematically illustrating partial operation states of the apparatus 1 for mounting components, according to exemplary embodiments.

Referring to FIGS. 1 through 5, the apparatus 1 for mounting components includes a component transfer guide 100, a component supplying unit, suction nozzles 312, substrate supporters 400, and a camera 500.

The component transfer guide 100 guides components C to move in one direction A1 so that the components C are transferred in a line. In the current exemplary embodiment, the components C are contained in component containing spaces TH of a carrier tape T, and the component transfer guide 100 guides transfer of the carrier tape T so as to guide transfer of the components C.

As illustrated in FIG. 2, the component transfer guide 100 is fixed to an upper side of a base unit 600, and an opening 110 is formed on the component transfer guide 100.

When the carrier tape T is disposed in the opening 110 of the component transfer guide 100, a protective film on the carrier tape T is removed before the carrier tape T reaches the opening 110 of the component transfer guide 100 so that the components C may be exposed to the outside.

Although not illustrated in the drawings, the removed protective film and the carrier film T that passes the opening 110 of the component transfer guide 100 are discharged outside of the component transfer guide 100.

The component transfer guide 100 is manufactured so that transfer speed of the carrier tape T may be controlled.

The detailed structure of the component transfer guide 100 is disclosed in various prior arts including KR 2009-0030476 filed by the applicant of the present invention, and thus, detailed descriptions thereof are omitted.

The component supplying unit supplies the components C to the component transfer guide 100. In the current exemplary embodiment, a reel 200, onto the carrier tape T is rolled, is disposed as the component supplying unit. The reel 200 supplies the carrier tape T, in which the components C are contained, to the component transfer guide 100, thereby supplying the components C to the component transfer guide 100.

The suction nozzles 312 suck and grab the components C, and transfers the components C to the substrate S. A plurality of suction nozzles 312 are disposed in a transferring direction A1 of the components C, that is, a direction parallel to an x-axis direction.

The suction nozzles 312 are disposed on the lower ends of nozzle spindles 310, wherein the nozzle spindles 310 are coupled to spindle bodies 320 so as to move up and down. Accordingly, the suction nozzles 312 may move up and down along with the nozzle spindles 310, and approach to or retreat from the components C disposed in the opening 110.

The plurality of spindle bodies 320 are coupled to a spindle holder 350 and arranged in the x-axis direction. The plurality of spindle bodies 320 may move relatively to each other so that an interval between the spindle bodies 320 may change. Referring to FIG. 2, guide rails 330 are disposed on the spindle holder 350, and extend in an x-axis direction. Sliders 340 are coupled to the guide rails 330, and slide along the guide rails 330. The spindle bodies 320 are fixed to the sliders 340 and thus may move relatively to each other in an x-axis direction. Therefore, intervals between each of the spindle bodies 320 may be changed. Accordingly, intervals between each of the suction nozzles 312 may be also changed.

The nozzle spindles 320, the spindle bodies 320, and the spindle holder 350 combined altogether are referred to as a mounter head 300. The mounter head 300 is coupled to a guiding member 620, which extends in the x-axis direction, may move along the guiding member 620. Also, the guiding member 620 may be coupled to rails 612 of a rail support unit 610 formed on the base unit 600. Since the rails 612 extend in a y-axis direction, the guiding member 620 may move in the y-axis direction. Accordingly, the mounter head 300, which is attached to the guiding member 620, may move along both the x-axis direction and the y-axis direction.

The nozzle spindles 310 may move upward and downward, that is, in a z-axis direction, and thus, the suction nozzles 312 formed on the nozzle spindles 310 may move in the x-axis, the y-axis, and the z-axis directions.

Although not illustrated, a driving unit for moving the spindle bodies 320 with respect to the spindle holder 350 may be further included in the mounter head 300.

The substrate supporters 400 support the substrate S, on which the components C are installed, and are interposed between the base unit 600 and the mounter head 300. The substrate supporters 400 are positioned to be spaced apart from the component transfer guide 100 in the transferring direction A1 of the components C. The substrate S is placed on the substrate supporters 400, and the substrate supporters 400 may move in the y-axis direction in order to move the substrate S in the y-axis direction.

The camera 500 is disposed below the mounter head 300, captures images of components C grabbed by the suction nozzles 312, and is interposed between the component transfer guide 100 and the substrate supporters 400.

As illustrated in FIGS. 3 through 5, the camera 500 includes a camera module 510 facing upward. Thus, when the suction nozzles 312 pass above the camera 500 while the suction nozzles 312 grab the components C, the camera 500 may capture the images of the components C thereabove. The captured images of the components C may be used in estimating the state of the grabbed components C.

Then, a method of mounting the components C by using the apparatus 1 for mounting components according to the current exemplary embodiment is described.

The carrier tape T rolled to the reel 200 is inserted into the component transfer guide 100, and is transferred to a direction A1 to reach the substrate supporters 400 so that the components C contained in the carrier tape T are transferred in a line.

While the carrier tape T passes the component transfer guide 100, a protective film on the carrier tape T is removed and the carrier tape T is disposed in the opening 110 so that the components C are exposed to the outside through the opening 110 of the component transfer guide 100.

Then, transfer of the carrier tape T is stopped, the mounter head 300 is disposed above the opening 110 of the component transfer guide 100, and then, the nozzle spindles 310 descend. Here, in order to match the intervals between the nozzle spindles 310 with intervals d1 between the components C disposed on the carrier tape T, the nozzle spindles 310 are moved relative to the spindle holder 350.

As illustrated in FIG. 3, when the nozzle spindles 310 descend, the components C are sucked and grabbed by the suction nozzles 312. When the components C are grabbed by the suction nozzles 312, the nozzle spindles 310 are raised to lift the components C.

Then, the mounter head 300 is moved and positioned above the substrate S while the components C are grabbed by the suction nozzles 312.

While the mounter head 300 moves from the component transfer guide 100 to the substrate S, the camera 500 is used to capture the image of the components C grabbed by the suction nozzles 312.

When the mounter head 300 is disposed above the substrate S, the intervals between the suction nozzles 312 are changed to be matched with intervals d2 of portions CL, on which the components C are disposed, on the substrate S. In the current exemplary embodiment, as illustrated in FIG. 2, the intervals d2 between the portions CL, on which the components C are disposed, on the substrate S are greater than the intervals d1 between the components C contained in the carrier tape T. Therefore, the nozzle spindles 310 are moved relative to the spindle holder 350 in order to widen the intervals between the suction nozzles 312.

When the intervals between the nozzle spindles 310 are changed according to the intervals d2 of the portions CL, on which the components C are disposed, on the substrate S, information contained in the image obtained from the camera 500 may be used to minutely control the location of the nozzle spindles 310.

Then, the nozzle spindles 310 are moved downward.

As illustrated in FIG. 5, when the nozzle spindles 310 move down, the components C are disposed on the portions CL on the substrate S. When the components C are disposed on the substrate S, suction power of the suction nozzles 312 is cleared, and the components C are remained on the substrate S. Then, the nozzle spindles 310 are raised again.

As such, when the components C are disposed on the substrate S, the mounter head 300 moves again to the upper side of the transfer guide 100, and the carrier tape T is again transferred so that the components C are again disposed on the opening 110 of the component transfer guide 100. Also, at the same time, the substrate supporters 400 move to the y-axis direction so that subsequent portions CL where other components C are installed, on the substrate, may be disposed on an extension line of a transferring path of the components C.

As the above operations are repeated, the components C are installed on the substrate S continuously.

In the apparatus 1 for mounting components according to the current exemplary embodiment, even if one reel 200 is used, the plurality of components C may be simultaneously installed on the substrate S. Accordingly, speed of installing the components C on the substrate S may be efficiently increased without using a plurality of reels.

Even if the components C are the same kind, deviations in performance of the components C may exist. In general, the deviations in the components contained in different reels are larger than the deviations in the components contained in a same reel. Accordingly, in order to reduce the performance deviations of the components C installed on the substrate S, it is desirable to use only one reel to supply the components C to the nozzle spindles 310 as the current exemplary embodiment.

In particular, when a plurality of light emitting diode packages are installed on a printed circuit board so as to manufacture a backlight unit, deviations in brightness of the light emitting diode packages need to be suppressed in order to make brightness of the backlight unit to be entirely uniform. Accordingly, in order to manufacture a backlight unit, the light emitting diode packages supplied from only one reel may be installed on a printed circuit board.

In this regard, when the apparatus 1 for mounting components according to the current exemplary embodiment is used, a plurality of light emitting diodes supplied from one reel 200 may be simultaneously installed on a printed circuit board, and thus, a backlight unit having entirely uniform brightness may be rapidly manufactured.

Also, in the apparatus 1 for mounting components according to the current exemplary embodiment, the intervals between the nozzle spindles 310 may be changed so that even if sizes of the components C or the type of the substrate S is changed, such a change may be easily managed.

Next, an apparatus 2 for mounting components according to another exemplary embodiment is described with reference to FIG. 6.

Figure 6:
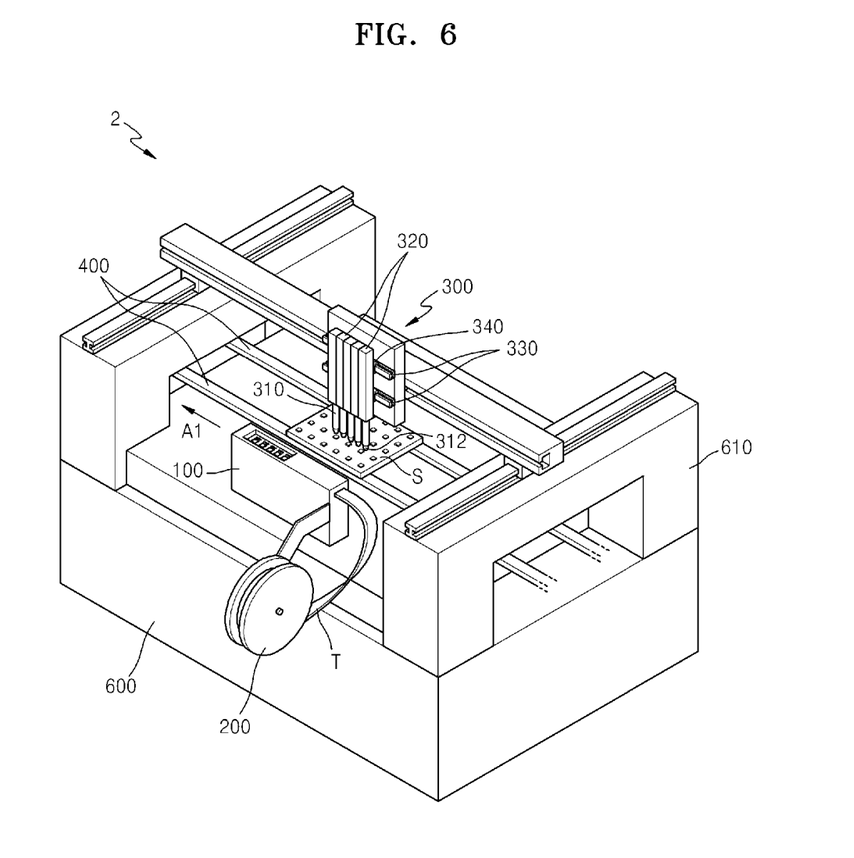
FIG. 6 is a perspective view schematically illustrating an apparatus for mounting components according to another exemplary embodiment.

Referring to FIG. 6, the apparatus 2 for mounting components according to the current exemplary embodiment includes the component transfer guide 100, the component supplying unit, the suction nozzles 312, and the substrate supporters 400.

The component transfer guide 100 according to the current exemplary embodiment is different from the component transfer guide 100 in the apparatus 1 for mounting components according to the previous exemplary embodiment in terms of arrangement of the component transfer guide 100 and the substrate supporters 400. Other structures and functions of the component transfer guide 100, the component supplying unit, the suction nozzles 312, and the substrate supporters 400 are similar to those in the apparatus 1 for mounting components of FIG. 1A.

As illustrated in FIG. 6, the component transfer guide 100 is disposed to extend in the x-axis direction and the substrate supporters 400 are disposed to be parallel to the component transfer guide 100. That is, the substrate supporters 400 are spaced apart from the component transfer guide 100 in a direction intercrossing the transferring direction A1 of the components C.

In this case, a transfer path of the mounter head 300 may be reduced compared with when the substrate supporters 400 is spaced apart from the component transfer guide 100 in the transferring direction A1 of the components C. Accordingly, time for installing the components C on the substrate S may be reduced, and thus, speed of installing the components C on the substrate S may be efficiently increased.

In the apparatus 2 for mounting components according to the current exemplary embodiment, the plurality of components C may be supplied from one reel 200, and thus, may be simultaneously installed on the substrate S, and the intervals between the suction nozzles 312 may be changed. Accordingly, even if the intervals d1 between the components C in the component transfer guide 100 are different from the intervals d2 between the portions CL, on which the components C are installed, on the substrate S, such a difference may be efficiently managed.

Next, an apparatus for mounting components according to still another exemplary embodiment is described with reference to FIG. 7.

Figure 7:
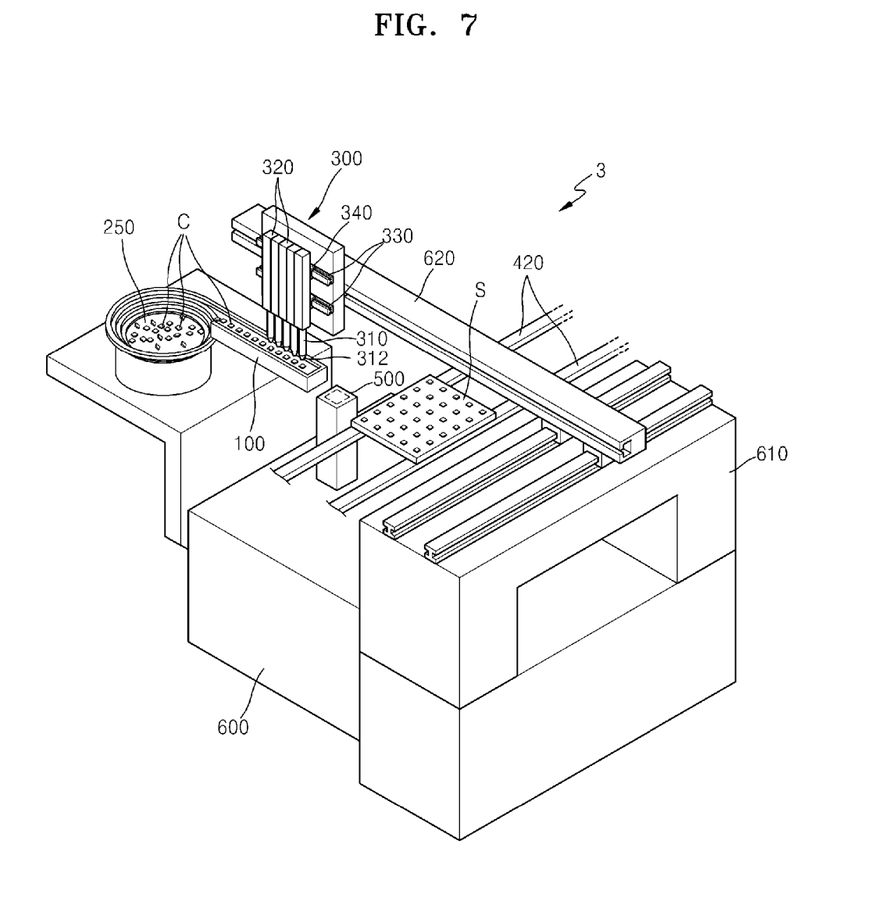
FIG. 7 is a perspective view schematically illustrating an apparatus for mounting components according to another exemplary embodiment.

FIG. 7 is a perspective view schematically illustrating an apparatus 3 for mounting components according to still another exemplary embodiment.

Referring to FIG. 7, the apparatus 3 for mounting components according to the current exemplary embodiment includes the component transfer guide 100, the component supplying unit, the suction nozzles 312, the substrate supporters 400, and the camera 500.

The structures and functions of the suction nozzles 312, the substrate supporters 400, and the camera 500 are similar to those in the apparatus 1 for mounting components of FIG. 1A, and thus, detailed description thereof is omitted.

As illustrated in FIG. 7, the component transfer guide 100 is disposed to extend in the x-axis direction and sidewalls are formed at both sides of the component transfer guide 100 so that the components C are guided and moved to the x-axis direction. An interval between the sidewalls is set to slightly greater than widths of the components C so that the components C may be transferred in a line.

In the current exemplary embodiment, the component supplying unit includes a vibratory bowl feeder 250. The components C are arranged in a bulk form on the vibratory bowl feeder 250. When the vibratory bowl feeder 250 vibrates, the components C are moved to the component transfer guide 100. The vibratory bowl feeder 250 is well-known to one of ordinary skill in the art, and thus, detailed description thereof is omitted.

In the apparatus 3 for mounting components according to the current exemplary embodiment, the components C arranged in a bulk form may be put into the vibratory bowl feeder 250 without using the carrier tape T containing the components C, and thus, costs for manufacturing the carrier tape T may be saved.

Also, a plurality of the bulk components C may be installed simultaneously using only one vibratory bowl feeder 250, and thus, speed for installing the components C on the substrate S may be increased. In addition, a manufacturing cost of the apparatus 3 for mounting components may be lower than when the apparatus for mounting components comprises a plurality of vibratory bowl feeders.

In the apparatus 3 for mounting components according to the current exemplary embodiment, the intervals between the suction nozzles 312 may be controlled. Accordingly, even if the intervals d1 between the components C in the component transfer guide 100 are different from the intervals d2 between the portions CL, on which the components C are installed, on the substrate S, such a difference may be efficiently managed. Also, even if sizes of the components C or the type of the substrate S are changed, such a change may be easily managed In the above exemplary embodiments, the nozzle spindles 310 may be moved by a driving unit (not illustrated). However, the nozzle spindles 310 may be moved by manual operation. In particular, when the intervals d1 between the components C in the component transfer guide 100 are the same as the intervals d2 between the portions CL, on which the components C are installed, on the substrate S, the locations of the nozzle spindles 310 are controlled manually so as to match the intervals between the nozzle spindles 310 with the intervals d1 between the components C. In this case, when the components C or the substrate S are changed, the intervals between the nozzle spindles 310 may be reset manually according to intervals between the components C.

Also, in the above exemplary embodiments, in order to change the intervals between the nozzle spindles 310, the spindle bodies 320 are combined to the guide rails 330 so as to slidably move; however, a mechanical structure to change the intervals between the nozzle spindles 310 is not limited thereto. For example, a mechanical mechanism for changing the intervals between the nozzle spindles 310 may include a gear system, a belt, and a pulley system.

In addition, in the above exemplary embodiments, the components C are transferred in a line by the component transfer guide 100; however, the components C may be transferred in a plurality of lines by the component transfer guide 100. In this case, the suction nozzles 312 may alternately install the components C in each line on the substrate S.

According to the exemplary embodiments, in the apparatus and method of mounting components, one component supplying unit may be used to supply components to a plurality of nozzle spindles.

According to the exemplary embodiments, in the apparatus and method of mounting components, even if sizes of the components or installation locations of the components on the substrate are changed, such a change may be easily managed.

While the inventive concept has been particularly shown and described with reference to the exemplary embodiments thereof, it will be understood by those of ordinary skill in the art that various changes in form and details may be made therein without departing from the spirit and scope of the inventive concept as defined by the following claims.

What is claimed is:

1. An apparatus for mounting a plurality of components, the apparatus comprising:
    a component supplying unit which supplies the components so that the components are transferred in at least one line;
    a component transfer guide which guides the components to be transferred in the at least one line; and
    a plurality of suction nozzles disposed to approach to or retreat from the components guided by the component transfer guide,
    wherein the component transfer guide exposes the components to an outside simultaneously,
    wherein the suction nozzles are arranged along a direction in which the components are guided by the component transfer guide, so that the suction nozzles approach to the components which are exposed to the outside at the component transfer guide, and
    wherein intervals between the plurality of suction nozzles are changeable along the direction in which the components are guided by the component transfer guide so that the suction nozzles correspond to positions of the components.

2. The apparatus of claim 1, wherein the plurality of suction nozzles are disposed parallel to the direction in which the components are guided by the component transfer guide.

3. The apparatus of claim 1, wherein the component supplying unit comprises a vibratory bowl feeder.

4. The apparatus of claim 1, wherein the component supplying unit comprises a reel that comprises a carrier tape containing the components.

5. The apparatus of claim 1, further comprising a substrate supporter, which supports a substrate, on which the components are installed, wherein the substrate supporter is disposed at a position apart from the component transfer guide in the direction in which the components are guided by the component transfer guide.

6. The apparatus of claim 5, wherein the substrate supporter transfers the substrate in a direction intercrossing the direction in which the components are guided by the component transfer guide.

7. The apparatus of claim 5, further comprising a camera interposed between the substrate supporter and the component transfer guide.

8. The apparatus of claim 1, further comprising a substrate supporter, which supports a substrate, on which the components are installed, wherein the substrate supporter is disposed at a position apart from the component transfer guide in a direction intercrossing the direction in which the components are guided by the component transfer guide.

9. The apparatus of claim 8, wherein the substrate supporter transfers the substrate in a direction parallel to the direction in which the components are guided by the component transfer guide.

10. The apparatus of claim 8, further comprising a camera interposed between the substrate supporters and the component transfer guide.

* * * * *